United States Patent [19]

Ahearn et al.

[11] Patent Number: 4,716,082

[45] Date of Patent: Dec. 29, 1987

[54] DUPLEX GLASS PREFORMS FOR HERMETIC GLASS-TO-METAL SEALING

[75] Inventors: John E. Ahearn, Middleboro; Raymond A. Frates, Fairhaven; Dennis Girard; Richard A. Koepke, both of New Bedford, all of Mass.; James K. Schmidt, Mt. Pleasant; C. Dodd Manon, Ligonier, both of Pa.

[73] Assignee: Isotronics, Inc., New Bedford, Mass.

[21] Appl. No.: 924,057

[22] Filed: Oct. 28, 1986

[51] Int. Cl.$^4$ .................................. B32B 17/06
[52] U.S. Cl. .................................. 428/428; 428/432; 174/52 S; 501/32; 357/74
[58] Field of Search ............... 428/120, 325, 428, 432

[56] References Cited

U.S. PATENT DOCUMENTS

| | | | |
|---|---|---|---|
| 3,370,874 | 2/1968 | Scherer et al. | 403/28 |
| 3,436,109 | 4/1969 | Loose | 428/432 |
| 3,600,017 | 8/1971 | Scherer | 403/29 |
| 3,864,112 | 2/1975 | Mattox et al. | 65/43 |
| 3,934,073 | 1/1976 | Ardezzone | 174/DIG. 3 |
| 3,963,505 | 6/1976 | Dumesnil et al. | 501/15 |
| 4,002,799 | 1/1977 | Dumesnil et al. | 428/428 |
| 4,008,945 | 2/1977 | Scherer | 350/1 |
| 4,019,388 | 4/1977 | Hall, II et al. | 73/398 |
| 4,041,548 | 8/1977 | Salisbury et al. | 361/396 |
| 4,186,023 | 1/1980 | Dumesnil et al. | 106/19 |
| 4,206,382 | 6/1980 | DuBois | 313/331 |
| 4,248,925 | 2/1981 | Ambrogi | 428/212 |
| 4,262,300 | 4/1981 | Scherer | 357/74 |
| 4,266,089 | 5/1981 | Scherer | 74/52 FP |
| 4,273,282 | 6/1981 | Norvell et al. | 228/116 |
| 4,285,002 | 8/1981 | Campbell | 357/74 |
| 4,342,553 | 8/1982 | Graff et al. | 431/358 |
| 4,414,282 | 11/1983 | McCollister et al. | 428/433 |
| 4,430,376 | 2/1984 | Box | 428/174 |
| 4,432,660 | 2/1984 | Norvell et al. | 403/29 |
| 4,480,148 | 10/1984 | Archer | 174/51 |
| 4,487,999 | 12/1984 | Baird et al. | 174/52 S |
| 4,524,238 | 6/1985 | Butt | 174/52 |
| 4,529,856 | 7/1985 | Meek et al. | 219/10.55 |
| 4,532,222 | 7/1985 | Butt | 501/32 |
| 4,542,259 | 9/1985 | Butt | 174/52 FP |
| 4,587,144 | 6/1986 | Kellerman et al. | 428/36 |
| 4,595,557 | 6/1986 | Bowsky | 419/49 |
| 4,606,748 | 8/1986 | Blake et al. | 65/36 |

Primary Examiner—John E. Kittle
Assistant Examiner—Terry J. Owens
Attorney, Agent, or Firm—Weingarten, Schurgin, Gagnebin & Hayes

[57] ABSTRACT

A duplex glass preform for forming hermetic glass-to-metal seals. The duplex glass preform comprises a glass infrastructure or matrix having at least one end thereof modified by the selective distribution therein of ceramic particles. The ceramic particles are selectively distributed to form a ceramic density gradient having the largest concentration of ceramic particles at the surface and gradually decreasing with depth. The duplex glass preform of the present invention has utility in forming glass-to-metal seals in hybrid metal packages containing microcircuit chips.

20 Claims, 5 Drawing Figures

DUPLEX GLASS PREFORMS FOR HERMETIC GLASS-TO-METAL SEALING

FIELD OF THE INVENTION

This invention relates to glass preforms for use in forming hermetic glass-to-metal seals, and more particularly to duplex glass preforms useful in forming matched glass-to-metal seals of improved strength and toughness.

BACKGROUND OF INVENTION

Hybrid metal packages have been used for many years to hermetically protect hybrid and semiconductor discrete and integrated circuit chips. The chips are mounted within the eyelet or body of the package and are electrically connected to external circuitry by means of conductive leads or pins passed through apertures in the body. To ensure hermetic sealing and to preclude short circuiting between the lead or pins and the metallic package the leads or pins are sealed in glass and the glass-pin combination is sealed in the body.

The formation of hermetic glass-to-metal seals, as exemplified in U.S. Pat. Nos. 3,370,874, 3,600,017 and 4,008,945, utilize glass and metal components possessing dissimilar coefficients of thermal expansion (CTE) so that as thermal energy is applied and removed during seal formation and during subsequent operational use the glass and metal components expand and contract, respectively, at different rates. Hermeticity in compression glass-to-metal seals is achieved, without bonding, by the compressive forces or physical stresses created between the components by the dissimilar rates of contraction and expansion.

Matched glass-to-metal seals, in contrast, are formed by utilizing glass and metal components possessing approximately equivalent CTEs so that as thermal energy is applied and removed during the sealing operation and during subsequent operational use the components expand and contract, respectively, at approximately the same rate. Commonly used materials for matched glass-to-metal seals are Kovar or F-15 metal alloy, an alloy containing approximately 17 percent cobalt, 29 percent nickel and 54 percent iron, and a borosilicate or "hard glass" such as Corning 7052. The CTEs of Kovar and hard glass are approximately equivalent, on the order of about $5.4 \times 10^{-6}$ in/in/° C.

Hermeticity in matched glass-to-metal seals is achieved by molecular bonding between the glass and metal components. The surfaces of the metal components interfacing with the glass are preconditioned prior to the sealing operation by the controlled growth of munsel-grey oxide on the interfacing surfaces of the metallic components. The body/glass/pin combination is assembled and thermal energy is applied thereto sufficient to partly fluidize or melt the glass. The surface tension of the partially fluidized glass causes it to wet the musel-grey oxide of the interfacing surfaces of the metal components. As thermal energy is withdrawn molecular bonding between the glass and metal components occurs to form the glass-to-metal seals.

FIG. 1 exemplifies a matched glass-to-metal 10 seal of the prior art wherein a hard glass preform 12 is sealed to an F-15 alloy terminal pin or lead 14 along interfacing surface 16 and to an F-15 alloy body 18 along interfacing surface 20. Positive menisci 22, 24 are formed at the ends of the interfaces 16, 20, respectively, i.e., at the boundary of the interfaces with the environment.

A large percentage of hybrid metal packages find end use in both high-tech industrial and governmental applications. It is therefore more efficacious, as a practical matter, to subject hybrid metal packages to quality control (QC) acceptance testing using QC standards meeting or exceeding government QC standards, rather than segregating hybrid metal package lots according to end use and then QC testing using different criteria. Not only would the latter procedure increase the overall production time and cost, necessitating for example tighter package lot control and segregation and recalibration or duplication of QC gear, but it would also vitiate the fungibility of finished metal packages.

Hybrid metal packages are generally subjected to four broad areas of QC testing: visual/mechanical; electrical; environmental; and line. Hybrid packages subjected to mechanical forces such as acceleration, shock or vibration, either during QC testing or in field use, have been found to experience a certain degradation in physical integrity.

Due to the partial fluidization and resolidification of the boundary layers of glass at the interfaces 16, 20 and the environmentally-exposed surfaces, compressive skin stresses are set up in the outer glass layers. When subjected to mechanical forces, matched glass-to-metal seals of the prior art have been found to be deleteriously affected by crack or fracture formation and glass chip-out.

Of particular concern are the glass menisci 22, 24 formed during the sealing operation, these menisci being brittle and of relatively low toughness, strength and ductility. The menisci 22, 24 are subject to the highest concentration of compressive skin stresses due to their structural configuration. The menisci 22, formed at the interface 16 of the glass 12-terminal pin 14, is especially vulnerable since most of the mechanical forces experienced by the hybrid packages are transmitted by means of the terminal pins or leads 14.

The largest single cause of hybrid metal package failure results from spreading meniscus cracks which exceed fifty percent of the distance from the terminal pin 14 to the eyelet 18 and/or glass chip-out from the meniscus 22.

A typical propagation route 26 for meniscus cracks is shown graphically in FIG. 2. In general a crack, once formed in the meniscus 22, proceeds inwardly into the glass 12 for some distance, and then at some point hooks back towards the surface of the meniscus 22, such that the crack propagation route 26 is generally "fishhook" shaped. The crack propagation route 26 is shown generally as A-B-C-D-E-F-G. A glass chip-out is shown generally at 28 and represents a segment of glass lost from the glass-to-metal seal as a result of a completed fishhook crack.

Cracks or fractures formed in the meniscus, or chip-out losses from the meniscus, adversely affect the physical integrity of hybrid metal packages. Theoretically, all hermetic packages leak to a certain extent. A "hermetic" package is pragmatically defined as one having an acceptable leak rate, and for most applications the hermeticity is satisfactory if the leak rate is equal to or less than $1 \times 10^{-8}$ cubic centimeters of helium per second at a pressure differential of one atmosphere. Cracks or chip-outs in the meniscus may cause the package to have a leak rate greater than $1 \times 10^{-8}$ cc/He/sec.

Matched glass-to-metal seals are generally subjected to a salt atmosphere during QC environmental testing. The salt atmosphere will readily penetrate any chip-outs or cracks formed in the meniscus, and if the penetration is sufficient to contact the terminal pin or lead, a corroding action will be engendered thereon. A corroded pin or lead may eventually result in the degradation or complete failure of the hybrid package.

Various solutions have been propounded to reduce the complications arising from meniscus cracking or chip-out loss. These include pressing the glass flat in the meniscus area, treating the glass surface with buffered or unbuffered fluoride ions, undersealing to reduce the degree of meniscus wickup and fire polishing at a slightly lower temperature than the fluidizing temperature during sealing. These solutions not only increase the cost of matched glass-to-metal seal, but adversely affect the characteristics of the glass-to-metal seal.

Another approach involves capping the glass preform with a ceramic disk. The ceramic disk and the glass preform, however, have dissimilar CTEs such that when the ceramic capped glass preform is subjected to thermal shock or extremes in temperature cycling the ceramic disk and the glass preform expand and contract at different rates. The disparity in expansion and contraction leads to crack or fracture formation and/or separation along the interface between the ceramic disk and glass preform.

SUMMARY OF THE INVENTION

The present invention surmounts the inherent disadvantages of the prior art by providing a duplex glass preform for use in forming matched glass-to-metal seals having enhanced strength and toughness. The infrastructure or matrix of the preform is comprised of a glass having utility in the formation of matched glass-to-metal seals. Corning 7052 glass, a borosilicate-type glass, is one such representative glass. Molybdenum sealed to 7059 glass provides another illustration.

Ceramic particles are selectively distributed in at least one end of the preform in a dispersion zone. It is to be understood that ceramic particles as used herein is a generic term, encompassing ceramic bodies having an essentially two dimensional configuration, i.e., flakes, as well as ceramic bodies having an essentially three dimensional configuration, i.e., particles. Selective distribution in the dispersion zone is controlled in two respects. First, the ceramic particles are distributed so as to have a gradually decreasing density gradient with depth, with the highest concentration or density of ceramic particles occuring at the end surface of the preform. Second, no ceramic particles are added in the boundary layer adjacent the interface or interfaces with metal components.

The duplex glass preform according to the present invention forms matched glass-to-metal seals of improved toughness and strength. In addition, matched glass-to-metal seals according to the present invention provide several orders of magnitude improvement in hermeticity, with leak rates of about $1 \times 10^{-9}$ or lower cc/He/sec being obtained. The selectively distributed ceramic particles limit the glass volume available for wetting at the glass-metal interfaces during sealing such that matched glass-to-metal seals according to the present invention have greatly reduced menisci. The ceramic particles inhibit the formation of meniscus cracks or fractures, and further act to confine any meniscus cracks or fractures formed to an extremely small area, thereby significantly reducing the probability of deleterious effects from meniscus cracks and greatly reducing chip-out loss.

BRIEF DESCRIPTION OF THE DRAWINGS

A more complete understanding of the present invention and the attendant advantages and features thereof will be more readily appreciated as the same becomes better understood by reference to the following detailed description when considered in conjunction with the accompanying drawings wherein.

DETAILED DESCRIPTION OF THE PREFERRED EMBODIMENTS

Figure 1:
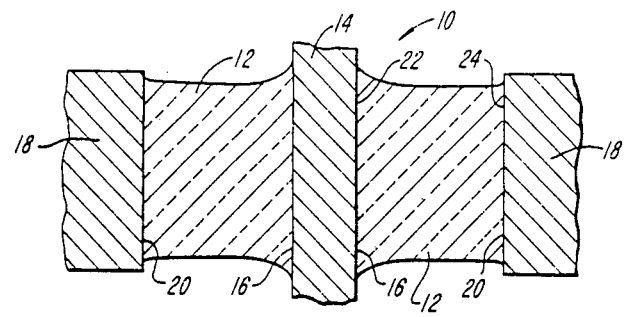
FIG. 1 is a partial cross-sectional view of a prior art matched glass-to-metal seal.
Figure 2:
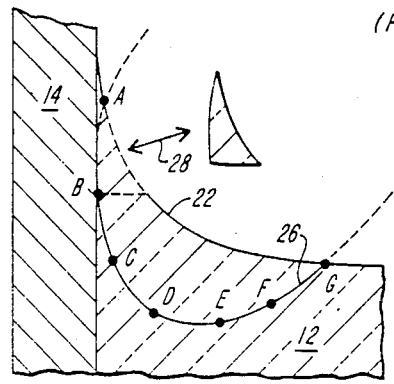
FIG. 2 is an expanded cross-sectional view of a prior art meniscus illustrating crack propagation and glass chip-out.
Figure 3A:
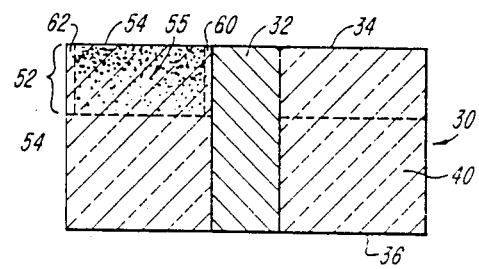
FIG. 3A is a cross-sectional view of a duplex glass preform according to the present invention.
Figure 4:
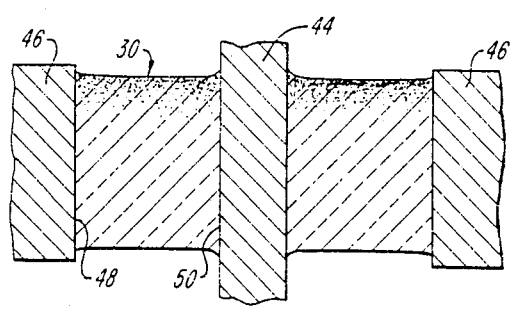
FIG. 4 is a partial cross-sectional view of a matched glass-to-metal seal according to the present invention.

Referring now to the drawings, wherein like reference numerals designate similar or corresponding elements throughout the several views, there is shown generally in FIG. 3A one embodiment of a duplex glass preform 30 according to the present invention. The preform 30 of FIG. 3A is adapted for forming matched glass-to-metal seals in hybrid microcircuit packages. The preform 30 is generally cylindrical in external configuration and has one or more terminal bores 32, each adapted to receive a conductive lead or terminal pin 44 (FIG. 4). For most hybrid package applications preforms 30 have a cylindrical length of about 40 mils to about 80 mils. Typically, one end 34 of the preform 30 will be exposed to an uncontrolled environment while the other end 36 will be exposed to the controlled environment of the hybrid package interior.

A matched glass-to-metal seal utilizing the preform 30 of FIG. 3A is exemplified in FIG. 4. The terminal pin 44 is sealed within the preform 30, which is sealed to a body or eyelet 46 of the hybrid package. The body 46 is the basic metal structure of the hybrid package and has a predetermined pattern of holes therein for receiving pin 44-containing preforms 30. Interfaces 48, 50 are defined between the preform 30 and the eyelet 46 and the terminal pin 44, respectively.

Referring back to FIG. 3A, the preform 30 of the present invention is a duplex composition. The infrastructure or matrix of the preform 10 is a glass 40 having utility in the formation of matched metal-to-glass seals. For matched glass-to-metal seals the thermal coefficient of expansion of the glass 40 should approximately match the thermal coefficient of expansion of the metal comprising the terminal pin 44 and the body 46. Corning 7052 glass or "hard glass", a borosilicate-type glasls, is a representative glass well known for utility in the formation of matched glass-to-metal seals. Hard glass is a solid solution, having about 7.5 percent alumina, $Al_2O_3$, uniformly dispersed in a silicone dioxide matrix. Using Corning 7052 glass as the glass 40 for the infrastructure, an iron-nickel-cobalt or a nickel-iron alloy, such as Kovar or F-15 , is an apposite metal for fabricating the terminal pin 44 and the body 46. Other suitable sealing glasses are available for use with molybdenum, tantalum, tungsten and other conductive metals.

A dispersion zone 52 is delineated at the uncontrolled environmental end 34 of the preform 30. The depth of the dispersion zone 52 is measured axially inwardly from the surface of the end 34. The depth range for the dispersion zone is from about 3 mils to about 15 mils, and has a preferred depth range of about 5 mils, plus or minus 1 mil. Thus, for the preferred depth range the dispersion zone 52 constitutes about 6 to about 13 percent of the overall length of the preform 30. It is to be understood that a dispersion zone, equivalent to the dispersion zone 52, may be delineated at the controlled environmental end 36 of the preform 30 where packaging requirements so dictate, and that different dimensional requirements relative to the glass preform are considered equally.

Ceramic particles 54 are selectively distributed or added in the glass 40 matrix within the dispersion zone 52, as shown in FIG. 3A, to form a supersaturated or modified glass 55. Ceramics as used herein includes the complex aluminosilicates or silicoalumnates, beryllia, and alumina. The ceramic particles 54 may be reinforced by having whiskers of silicon carbide dispersed therein. For a glass 40 matrix comprised of Corning 7052 glass, ceramic particles 52 of alumina, $Al_2O_3$, are most advantageously employed. Thus, the duplex preform 30 according to the present invention comprises the glass 40 of the matrix and the modified glass 55 of the dispersion zone 52.

Figure 3B:
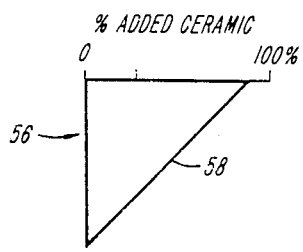
FIG. 3B is an added ceramic density gradient profile.

The ceramic particles 54 are selectively added to the glass 40 in such manner that a ceramic density gradient profile 56, depicted generally in FIG. 3B, is created. A slope 58 of the ceramic density is preferably approximately linear so that there is a gradual transition in concentration or density of ceramic particles 54 with depth. The gradual transition in density eliminates fracture or cleavage planes within the dispersion zone 52 which would impair the physical integrity of the preform 30. The concentration or density of added ceramic particles 54 is greatest at the surface of end 34, gradually decreasing to zero. For a preferred embodiment wherein the glass 40 is hard glass and the ceramic particles 54 are alumina, one skilled in the art will readily appreciate that hard glass contains about 7.5 percent alumina predispersed n solid solution therein. The total of predispersed ceramic and the added ceramic particles 54 could be as high as 60 percent, depending upon bead size and configuration. Thus, in describing ceramic particles 54 added to the glass 40 comprising the matrix, it is to be understood that these ceramic particle 54 are over and above any similar particulate material normally contained in the glass 40.

By way of illustration only, for a preform 30 comprised of hard glass 40 and having alumina particles 54 distributed in the dispersion zone 52 the approximate percentage ranges for added alumina particles 54 is: about 75 percent to about 90 percent at the surface layer; about 60 percent to about 75 percent at a depth of about 2 mils; and less than about 15 percent to about 25 percent at a depth of about 5 mils. By a depth of about 10 mils to about 15 mils the percentage of added alumina particles 54 is about zero.

Formation of the ceramic density gradient is facilitated by controlling the size-grade of ceramic particles 54 distributed within the glass 40. The coarsest grade of ceramic particles 54 are added at the surface of end 34, with succeedingly less coarse or finer grades distributed with increasing depth. The preferred range of grades for ceramic particles 54 is about 50 microns to about 200 microns, fine-to-coarse. This grade range ensures that the ceramic particles 54-glass 40 combination in the dispersion zone 52 is not deleteriously affected when subjected to thermal shocks or temperature cycling due to any dissimilarities in CTEs between the added ceramic particles 54 and the glass 40.

The addition of ceramic particles in a glass matrix causes a reduction in the wetting or flow characteristics of the ceramic-glass combination by reducing the surface tension of the modified glass 55. Hermeticity in matched glass-to-metal seals, however, is achieved by the molecular bonding of molten glass to the oxides formed on the surfaces of the terminal pin 44 and body 46. To ensure the requisite wetting of the surfacesof the terminal wire 44 and body 46 over the interfaces 50, 48, respectively, relatively ceramic-free zones 60, 62 are formed adjacent the dispersion zone 52 adjacent interfaces 50, 48, respectively. The ceramic-free zone 60, 62, as the name indicates, contain no added ceramic particles 54, but it is to be understood may contain ceramic material dispersed in solid solution in the glass 40, depending upon the glass 40 and ceramic particles 54 combination selected.

Surface tension and volume affect the wetting characteristics of glass. As the preform 30 of the present invention is partially fluidized by heating during the sealing operation, the surface tension of the glass 40 adjacent interfaces 48, 50 is reduced such that the glass 40 wets the oxidized surfaces of the terminal wire 44 and body 46. The wetting is sufficient to ensure molecular bonding therebetween. At the same time the modified glass 55, by means of the added ceramic particles 54, limits the volume of glass 40 available for wetting the oxidized surfaces of the body 46 and the terminal pin 44 adjacent the dispersion zone 52. The net result is that while adequate molecular bonding is achieved, there is a concomitant significant reduction in size of the meniscus formed. By appropriate control of the density gradient of the ceramic particles 54, the menisci at the interfaces 48, 50 of the end 34 may be almost completely eliminated.

The duplex preform 30 according to the present invention may be fabricated by methods known to those skilled in the art. Multi-constituent pill making machines, for example, may be readily adapted for forming duplex preforms 30. Powdered glass 40 and a graded composition of ceramic particles 54 are suitably disposed in the machine molds and then loosed pressed to form molded preforms. The molded preforms are then sintered at temperatures of about 300° to 700° C. to form the duplex preform 30 of the present invention.

The duplex preform 30 of FIG. 3A is advantageously utilized in the fabrication of hybrid metal packages having matched glass-to-metal seals. The sealing operation may be either a one or two step operation. In a one step operation the terminal pin 44 is disposed in the terminal bore 32 of the preform 30 with the oxidized surface of the terminal pin 44 adjacent interface 50. The terminal pin 44-preform 30 is disposed in an aperture of the body 46 adjacent interface 48. Sealing is accomplished by heating the loosely assembled combination to a temperature somewhat above the melting point of the glass 40. This temperature is maintained for a time sufficient to ensure fluidization of the boundary layers of the glass 40, the fluidized glass wetting the interfaces 48, 50. Upon cooling to room temperature molecular bonding occurs at the interfaces 48, 50 to form a hybrid metal package having matched glass-to-metal seals. For a two step sealing operation all metal components are first lightly preoxidized, without glass present; then final oxidation takes place in the presence of glass.

Hybrid metal packages fabricated with duplex preforms according to the present invention have matched glass-to-metal seals of improved strength and toughness, and concomitantly less susceptibility to terminal pin corrosion. The ceramic particles selectively added to the glass infrastructure or matrix limit the glass volume available for wetting, thereby reducing or eliminating the menisci resulting from sealing. Further, the ceramic particles inhibit the formation or spread of meniscus cracks or fractures, thereby significantly reducing chip-out loss in the seal.

It has also been determined that there is a dramatic increase in hermeticity for hybrid metal packages fabricated with duplex preforms according to the present invention. A pragmatically acceptable hermeticity for most applications is a leak rate of $1 \times 10^{-8}$ cc/He/sec at a pressure differential of one atmosphere. Leak checking of hybrid metal packages formed according to the present invention revealed leak rates several orders of magnitude lower than the pragmatically acceptable leak rate, i.e., leak rates of about $1 \times 10^{-11}$ to $10^{-12}$ cc/He/sec at a pressure differential of one atmosphere. The enhanced hermeticity of hybrid metal packages utilizing duplex preforms according to the present invention is attributed to an increase in compressive skin stresses engendered by the addition of ceramic particles.

In another embodiment of the present invention the terminal pins 44 disposed in the duplex preform 30 are plated with one or more corrosion-resistant materials. In general, glass will not bond or adhere to a metal which is not oxidized. The oxide layer formed of the metal surface, as described above, is soluble in both glass and metal, and as a consequence, acts as a "cement" to ensure molecular bonding between the metal and glass. Plated metals, in general, do not readily oxidize, and therefore the terminal pins 44 must be clad in such a manner that a cladding-free zone is provided adjacent interface 50. Terminal pins 44 comprised of Kovar or F-15 alloy, by way of example, may be clad with about 100 to about 150 microinches of substrate nickel and about 50 microinches of a noble metal such as palladium or gold to reduce susceptibility to corrosion.

The majority of terminal pins in hybrid metal packages are electrically connected to terminal areas of the microcircuit chips embodied therein. However, at least one terminal pin will often function as a ground lead. This terminal pin is grounded by strapping or electrically connecting the interior portion of the terminal pin to the package body. This grounding operation may be more readily facilitated by utilizing a modified duplex preform according to the present invention. The modified duplex preform of this embodiment is as described with respect to the embodiment of FIG. 3A above except that the glass 40 comprising the matrix of the duplex preform has homogeneously distributed therein in solid solution conductive metallic particles. Sufficient conductive metallic particles are added to the glass 40 so that the modified duplex preform will conduct an electrical current. A terminal pin 44 disposed in the modified duplex preform will thus be inherently grounded to the body 46 by means of the modified preform. Metallic particles of Kovar or F-15 alloy are advantageously used as the conductive filler for the glass 40 matrix since the CTE of Kovar approximately matches that of borosilicate-type glasses. A minimum forty percent addition of Ni-Co-Fe particles to the glass 40 matrix converts the modified preform from an electrically-insulating body to a conductive body.

Duplex preforms according to the present invention form matched glass-to-metal seals of greatly enhanced hermeticity, as described hereinabove. As such the duplex preforms of the present invention may be advantageously utilized as sealing or safety plugs in packages subjected to a high pressure environment. The duplex preform of this embodiment is as described with respect to FIG. 3A above, except that it is of solid cylindrical configuration rather than the toroidal configuration of preform 30, i.e., no terminal bores 32 are formed therein. Matched glass-to-metal seals formed with solid cylindrical duplex preforms are able to understand pressures of about 2500 lbs/in$^2$ before seal rupture.

Numerous modifications and variations of the present invention are possible in light of the above teachings. It is therefore to be understood that within the scope of the appended claims, the present invention may be practiced otherwise than as specifically described herein above.

What is claimed is:

1. A duplex glass preform for forming hermetic glass-to-metal seals, comprising:
    a glass matrix, said glass matrix having a peripheral interfacing surface for glass-to-metal sealing;
    a dispersion zone in at least one end of said glass matrix, said dispersion zone extending inwardly from a surface of said at least one end into said glass matrix for a predetermined depth;
    a substantially ceramic-free zone intermediate said dispersion zone and said peripheral interfacing surface; and
    a plurality of ceramic particles selectively distributed in said dispersion zone of said glass matrix to form a ceramic particle density gradient therein, and wherein said ceramic particle density gradient has a maximum value at said surface and gradually decreases to a near zero value at said predetermined depth.

2. The duplex glass preform according to claim 1 wherein said glass matrix further comprises a hard glass matrix.

3. The duplex glass preform according to claim 2 wherein said plurality of ceramic particles further comprises a plurality of alumina particles.

4. The duplex glass preform according to claim 1 wherein said predetermined depth is a value selected from a range of values of about 3 mils to about 15 mils.

5. The duplex glass preform according to claim 4 wherein said value is about 5 mils.

6. The duplex glass preform according to claim 1 wherein said plurality of ceramic particles further comprises a plurality of size-graded ceramic particles having a gradation range of coarse to fine, and wherein said size-graded ceramic particles are selectively distributed so that said coarse to fine gradation range corresponds to said ceramic particle density gradient.

7. The duplex glass preform according to claim 6 wherein said coarse to fine gradation range is about 200 microns to about 50 microns.

8. The duplex glass preform according to claim 1 wherein said glass matrix further includes at least one terminal bore therethrough substantially parallel to said peripheral interfacing surface, and wherein said at least one terminal bore has an interfacing surface for glass-to-metal sealing, and further including a ceramic-free zone intermediate said terminal bore interfacing surface and said dispersion zone.

9. The duplex glass preform according to claim 8 wherein said glass matrix further includes a plurality of conductive metallic particles homogeneously distributed in solid solution therein such that said duplex glass preform is electrically conductive.

10. The duplex glass preform according to claim 9 wherein said plurality of conductive metallic particles further comprises a plurality of nickel-cobalt-iron particles.

11. The duplex glass preform according to claim 1 further including a dispersion zone in said glass matrix in opposed relation to said dispersion zone in said at least one end.

12. A hermetic glass-to-metal sealed package for microcircuit chips, comprising:
 a duplex glass preform, said duplex glass preform further comprising
 a glass matrix having a peripheral interfacing surface and at least one terminal bore therethrough substantially parallel to said peripheral interfacing surface, said terminal bore having an interfacing surface,
 a dispersion zone in at least one end of said glass matrix, said dispersion extending inwardly from a surface of said at least one end into said glass matrix for a predetermined depth,
 a first substantially ceramic-free zone intermediate said dispersion zone and said peripheral interfacing surface,
 a second substantially ceramic-free zone intermediate said dispersion zone and said terminal bore interfacing surface, and
 a plurality of ceramic particles selectively distributed in said dispersion zone of said glass matrix to form a ceramic particle density gradient therein, and wherein said ceramic particle density gradient has a maximum value at said surface and gradually decreases to a zero value at said predetermined depth;
 a terminal pin correspondingly disposed in said at least one terminal bore and hermetically sealed thereto; and
 a body having at least one aperture therein adapted to receive said duplex glass preform, and wherein said duplex glass preform is hermetically sealed in said body.

13. The hermetic package according to claim 12 wherein said glass matrix further comprises a hard glass matrix.

14. The hermetic package according to claim 12 wherein said plurality of ceramic particles further comprises a plurality of alumina particles.

15. The hermetic package according to claim 12 wherein said terminal pin and said body is an alloy selected from a group of iron-nickel-cobalt and nickel-iron alloys.

16. The hermetic package according to claim 15 wherein said terminal pin is plated with nickel and further plated with a metal selected from a group noble metals, plating being done in such manner that a surface on said terminal pin corresponding to said terminal bore interfacing surface remains unplated.

17. The hermetic package according to claim 12 wherein said glass matrix further includes a plurality of conductive metallic particles homogeneously distributed in solid solution therein such that said duplex glass preform acts as an electrically conductive pathway between said terminal pin and said body.

18. The hermetic package according to claim 17 wherein said terminal pin and exposed surfaces of said glass matrix are plated with nickel and further plated with a metal selected from the nobel metal group.

19. The hermetic package according to claim 12 further including a dispersion zone in said glass matrix in opposed relation to said dispersion zone in said at least one end.

20. The hermetic package according to claim 12 wherein said plurality of ceramic particles further comprises a plurality of size-graded ceramic particles having a gradation range of coarse to fine, and wherein said size-graded ceramic particles are selectively distributed so that said coarse to fine gradation range corresponds to said ceramic particle density gradient.

* * * * *